US009252012B2

(12) United States Patent
Park et al.

(10) Patent No.: US 9,252,012 B2
(45) Date of Patent: Feb. 2, 2016

(54) METHOD OF FABRICATING A NITRIDE SUBSTRATE

(71) Applicant: Seoul Viosys Co., Ltd., Ansan-si (KR)

(72) Inventors: Ki Yon Park, Ansan-si (KR); Hwa Mok Kim, Ansan-si (KR); Chang Suk Han, Ansan-si (KR); Hyo Shik Choi, Ansan-si (KR); Mi So Ko, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/833,732

(22) Filed: Aug. 24, 2015

(65) Prior Publication Data

US 2015/0364319 A1    Dec. 17, 2015

Related U.S. Application Data

(63) Continuation of application No. PCT/KR2014/001024, filed on Feb. 6, 2014.

(30) Foreign Application Priority Data

Feb. 28, 2013    (KR) .................. 10-2013-0021801

(51) Int. Cl.
*H01L 21/302*    (2006.01)
*H01L 31/0328*    (2006.01)
(Continued)

(52) U.S. Cl.
CPC ........ *H01L 21/0254* (2013.01); *H01L 21/0262* (2013.01); *H01L 21/02389* (2013.01);
(Continued)

(58) Field of Classification Search
CPC ............ H01L 21/02458; H01L 33/007; H01L 31/184; H01L 21/2654; H01L 21/76254; H01L 21/31116; H01L 21/32139; H01L 21/31144; H01L 21/31111; H01L 21/76831; H01L 21/32134; H01L 21/02247; H01L 21/02126; H01L 21/02164; H01L 27/1214; C30B 23/02; C30B 29/40
USPC ......... 438/458, 689, 706, 739, 745, 758, 761; 257/189, 414, 618, 622
See application file for complete search history.

(56) References Cited

U.S. PATENT DOCUMENTS 8,853,057 B2 * 10/2014 Wuu .................... H01L 33/007
257/622
2005/0167002 A1    8/2005 Ghyselen et al.
(Continued)

FOREIGN PATENT DOCUMENTS

| JP | 2001-223165 | 8/2001 |
| JP | 2004-039810 | 2/2004 |
| JP | 2007-266472 | 10/2007 |

OTHER PUBLICATIONS

International Search Report mailed on May 27, 2014, in International Application No. PCT/KR2014/001024.
(Continued)

*Primary Examiner* — Hsien Ming Lee
(74) *Attorney, Agent, or Firm* — H.C. Park & Associates, PLC

(57) ABSTRACT

A method of fabricating a nitride substrate including preparing a growth substrate and disposing a sacrificial layer on the growth substrate. The sacrificial layer includes a nitride horizontal etching layer including an indium-based nitride and an upper nitride sacrificial layer formed on the nitride horizontal etching layer. The method of fabricating the nitride substrate also includes horizontally etching the nitride horizontal etching layer, forming at least one etching hole at least partially through the upper nitride sacrificial layer such that the at least one etching hole expands in the nitride horizontal etching layer in a horizontal direction during horizontal etching of the nitride horizontal etching layer, forming a nitride epitaxial layer on the upper nitride sacrificial layer by hydride vapor phase epitaxy (HVPE) and separating the nitride epitaxial layer from the growth substrate at the nitride horizontal etching layer.

27 Claims, 6 Drawing Sheets

(51) Int. Cl.
*H01L 29/06* (2006.01)
*H01L 21/02* (2006.01)
*H01L 21/306* (2006.01)
*H01L 21/308* (2006.01)
*H01L 29/20* (2006.01)

(52) U.S. Cl.
CPC .... *H01L21/02458* (2013.01); *H01L 21/02505* (2013.01); *H01L 21/02664* (2013.01); *H01L 21/3081* (2013.01); *H01L 21/3086* (2013.01); *H01L 21/30621* (2013.01); *H01L 29/2003* (2013.01)

(56) References Cited

U.S. PATENT DOCUMENTS

2006/0160334 A1   7/2006   Park
2007/0072396 A1   3/2007   Feltin et al.
2011/0127567 A1*  6/2011   Seong ................. H01L 33/0079
                                                                257/99

OTHER PUBLICATIONS

Written Opinion of the International Searching Authority mailed May 27, 2014, in International Application No. PCT/KR2014/001024.

* cited by examiner

METHOD OF FABRICATING A NITRIDE SUBSTRATE

CROSS-REFERENCE TO RELATED APPLICATIONS

This application is a continuation of International Application PCT/KR2014/001024, filed on Feb. 6, 2014, and claims priority from and the benefit of Korean Patent Application No. 10-2013-0021801, filed on Feb. 28, 2013, which are both incorporated by reference for all purposes as if fully set forth herein.

BACKGROUND

1. Field

Exemplary embodiments relate to a method of fabricating a nitride substrate. More particularly, exemplary embodiments relate to a method of fabricating a nitride substrate having high quality and low density of defects such as dislocations.

2. Discussion of the Background

Among III-V based compound semiconductors, nitride semiconductors (i.e., aluminum-based nitride, gallium-based nitride, and indium-based nitride semiconductors) have excellent electromagnetic characteristics. Thus, nitride semiconductors have been recently been utilized in light emitting diodes, photo-detectors, and high-speed electronic devices. In particular, gallium nitride (GaN) is commonly used to manufacture semiconductor devices because gallium nitride has an energy band-gap of 3.4 eV and has direct transition type characteristics.

In fabrication of a gallium nitride semiconductor, a homogeneous substrate along with the gallium nitride semiconductor may be used as a growth substrate. However, gallium nitride has a melting point of over 2,000° C. and a very high nitrification vapor pressure. Thus, it is difficult to fabricate an ingot of gallium nitride and a gallium nitride substrate. To make the fabrication of gallium nitride easier, a heterogeneous substrate (i.e., sapphire ($Al_2O_3$) substrate, a silicon carbide (SiC) substrate, and a silicon (Si) substrate) is used as a growth substrate instead of a homogeneous substrate. However, the gallium nitride semiconductor fabricated using the heterogeneous substrate typically has a high defect density due to a difference in the lattice parameter and the coefficient of thermal expansion between the heterogeneous substrate and the gallium nitride semiconductor. Such a high defect density can cause deterioration in the operational characteristics of the gallium nitride semiconductor.

A gallium nitride substrate is generally fabricated by growing a single nitride crystal layer to hundreds of micrometers on a heterogeneous substrate, such as a sapphire substrate or a silicon carbide substrate, through metal organic chemical vapor deposition (MOCVD) or hydride vapor phase epitaxy (HVPE), followed by separating the heterogeneous substrate from the single crystal layer through laser lift-off (LLO).

However, MOCVD allows growth of a gallium nitride epitaxial layer at a rate of several hundred micrometers per hour at most. Thus, it is very difficult to grow a gallium nitride substrate having a thickness of hundreds of micrometers. Also, the effectiveness of MOCVD is low due to high costs of metal organic sources and equipment operation. In contrast, HVPE allows growth of a gallium nitride epitaxial layer at a rate of 100 μm/hour or more. Thus, it is possible to fabricate a gallium nitride substrate having a thickness of hundreds of micrometers within a relatively short period of time. In addition, since HVPE employs gallium and ammonia gas as Ga and N sources, HVPE is more economical than MOCVD.

As briefly described above, sapphire used for growth of the gallium nitride epitaxial layer causes generation of stress and strain from an interface between a sapphire substrate and the gallium nitride epitaxial layer due to a significant difference in the lattice parameter (about 16%) and the coefficient of thermal expansion (about 35%) between the sapphire substrate and the gallium nitride epitaxial layer. Such stress and strain may cause lattice defects, bowing and cracking of the gallium nitride epitaxial layer, and deterioration in the quality of the manufactured gallium nitride substrate. In particular, when the gallium nitride epitaxial layer is grown using HVPE, the grown gallium nitride epitaxial layer typically has a relatively high defect density and may suffers from frequent bowing and cracking due to a very high growth rate. In addition, when the gallium nitride epitaxial layer is grown to a thickness of 10 μm or more on the sapphire substrate, thicker gallium nitride epitaxial layer may reduce a radius of curvature, thereby causing a higher degree of bowing. As a result, stress is further increased, thereby causing a higher density of cracks. Furthermore, when temperature is lowered after growth of the gallium nitride epitaxial layer, local cracking at a high stress region of the epitaxial layer can be propagated to the entirety of the epitaxial layer, and a gallium nitride substrate made from the gallium nitride epitaxial layer having cracks cannot be used as a growth substrate for a gallium nitride semiconductor.

Moreover, when a laser is employed to separate the heterogeneous substrate, such as a sapphire substrate from the gallium nitride epitaxial layer, the substrate is gradually separated from a partial portion of the interface between the substrate the gallium nitride epitaxial layer to the entirety thereof since a laser beam has a much smaller cross-sectional area than the overall area of the interface. As a result, stress and strain are first released at a portion of the interface, thereby causing cracking of the gallium nitride epitaxial layer or fracture of the entire substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of fabricating a nitride substrate capable of relieving stress due to a difference in the lattice parameter and the coefficient of thermal expansion between a growth substrate and a nitride epitaxial layer.

Exemplary embodiments also provide a method of fabricating a nitride substrate having a low defect density (i.e., a low dislocation density) by enhancing crystallinity of a nitride epitaxial layer and allowing uniform separation between the nitride epitaxial layer and a growth substrate.

Additional aspects will be set forth in the detailed description which follows, and, in part, will be apparent from the disclosure, or may be learned by practice of the inventive concept.

An exemplary embodiment discloses a method of fabricating a nitride substrate including preparing a growth substrate and forming a sacrificial layer on the growth substrate. The sacrificial layer includes a nitride horizontal etching layer including an indium-based nitride and an upper nitride sacrificial layer formed on the nitride horizontal etching layer. The method of fabricating the nitride substrate also includes horizontally etching the nitride horizontal etching layer, forming at least one etching hole at least partially through the upper nitride sacrificial layer such that the at least one etching hole expands in the nitride horizontal etching layer in a horizontal direction during horizontal etching of the nitride horizontal etching layer, forming a nitride epitaxial layer on the upper nitride sacrificial layer by hydride vapor phase epitaxy (HVPE) and separating the nitride epitaxial layer from the growth substrate at the nitride horizontal etching layer.

The forming of the at least one etching hole may include exposing the upper nitride sacrificial layer to an etching gas at a first temperature.

The first temperature may range from 900° C. to 1200° C.

The horizontal etching of the nitride horizontal etching layer may include at least one of recrystallization of the nitride horizontal etching layer and pyrolysis of the nitride horizontal etching layer.

The etching gas may include at least one of chlorine gas and ammonia gas.

The horizontal cross-sectional area of the at least one etching hole within the nitride horizontal etching layer may be larger than a different cross-sectional area of the at least one etching hole on a surface of the upper nitride sacrificial layer.

Forming of the nitride epitaxial layer may include forming a void on an upper surface of the sacrificial layer.

The nitride horizontal etching layer may include an alternately stacked structure of InxGa1-xN layers and AlyIn1-yN layers (0<x<1, 0<y<1).

The sacrificial layer may be formed by metal organic chemical vapor deposition (MOCVD).

The sacrificial layer may further include a lower nitride sacrificial layer formed under the nitride horizontal etching layer.

The nitride epitaxial layer may be formed at a second temperature and separating of the nitride epitaxial layer from the growth substrate may be performed at a third temperature lower than the second temperature.

The nitride epitaxial layer may be separated from the growth substrate through natural separation of the nitride horizontal etching layer during cooling from the second temperature to the third temperature.

The separating of the nitride epitaxial layer from the growth substrate may further include applying stress to the nitride horizontal etching layer.

The method of fabricating a nitride substrate may further include removing the upper nitride sacrificial layer and the nitride horizontal etching layer from the separated nitride epitaxial layer.

The method of fabricating a nitride substrate may further include forming a first mask pattern including a first opening portion and a first masking portion on the upper nitride sacrificial layer before forming the nitride epitaxial layer and forming a first nitride layer on the upper nitride sacrificial layer to cover the first mask pattern before forming the nitride epitaxial layer.

The forming the first nitride layer may include forming at least one void on a surface of the sacrificial layer between the first nitride layer and the sacrificial layer.

The first opening portion of the first mask pattern may have a width of 2 μm to 20 μm.

The method of fabricating a nitride substrate may further include forming a second mask pattern including a second opening portion and a second masking portion on the first nitride layer before forming the nitride epitaxial layer. The method of fabricating a nitride substrate may also include forming a second nitride layer on the first nitride layer to cover the second mask pattern. The second masking portion of the second mask pattern may be formed on the first opening portion of the first mask pattern.

The method of fabricating a nitride substrate may further include forming a buffer layer on the growth substrate before forming the sacrificial layer.

The growth substrate may include a sapphire substrate.

The nitride epitaxial layer separated from the growth substrate may be a gallium nitride (GaN) substrate.

The nitride horizontal etching layer may further include an n-type dopant.

forming the first nitride layer may include further horizontally etching the nitride horizontal etching layer.

An exemplary embodiment also discloses a method of fabricating a nitride substrate including preparing a growth substrate and forming a sacrificial layer on the growth substrate. The sacrificial layer includes a nitride horizontal etching layer including indium gallium nitride (InGaN) and an upper gallium nitride (GaN) layer formed on the nitride horizontal etching layer. The method of fabricating a nitride substrate also includes partially etching the sacrificial layer to form etching holes, at least some of the etching holes extending to the nitride horizontal etching layer through the upper gallium nitride (GaN) layer, forming a nitride epitaxial layer on the upper gallium nitride (GaN) layer using hydride vapor phase epitaxy (HVPE), and separating the nitride epitaxial layer from the growth substrate. The nitride epitaxial layer is separated from the growth substrate at the nitride horizontal etching layer, and an average width of a first portion of at least one of the etching holes formed in the upper gallium nitride (GaN) layer is less than that of a second portion of the at least one of the etching holes formed in the nitride horizontal etching layer.

The upper gallium nitride (GaN) layer may have a thickness less than the nitride horizontal etching layer.

An exemplary embodiment also discloses a wafer for fabrication of a nitride substrate. The wafer includes a growth substrate and a sacrificial layer disposed on the growth substrate. The sacrificial layer includes a nitride horizontal etching layer and an upper nitride sacrificial layer disposed on the nitride horizontal etching layer. The wafer also includes a nitride epitaxial layer disposed on the sacrificial layer. The sacrificial layer includes at least one etching hole extending to the nitride horizontal etching layer through the upper nitride sacrificial layer. The etching hole includes a horizontal etching region disposed within the nitride horizontal etching layer.

An average width of a first portion of at least one of the etching holes disposed in the upper nitride sacrificial layer may be less than that of a second portion of the at least one of the etching holes disposed in the nitride horizontal etching layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the invention and are incorporated in and constitute a part of this specification, illustrate exemplary embodiments of the inventive concept, and, together with the description serve to explain the principles of the inventive concept.

DETAILED DESCRIPTION OF THE ILLUSTRATED EMBODIMENTS

Figure 1A:
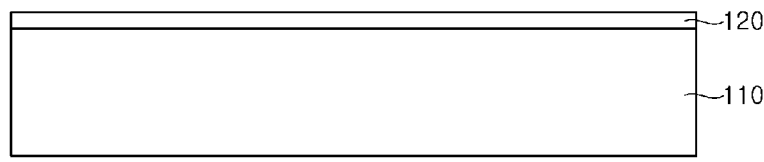
FIGS. 1A, 1B, 1C, and 1D are sectional views illustrating a method of fabricating a nitride substrate according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1A, 1B, 1C, 1D, 2, 3A, 3B, 4A, 4B, 5A, 5B, 5C, 5D, 6A, 6B, 7, 8, and 9 are sectional views, plan views and a perspective view illustrating a method of fabricating a nitride substrate in accordance with exemplary embodiments. FIG. 3B is a perspective view of a process of partially etching a sacrificial layer 130. FIGS. 5A, 5B, 5C, and 5D are plan views illustrating shapes of a first mask pattern 150.

Referring to FIGS. 1A, 1B, 1C, and 1D, a growth substrate 110 may be prepared, and a sacrificial layer 130 including a lower nitride sacrificial layer 131, a horizontal etching layer, and an upper nitride sacrificial layer 135 may be disposed or otherwise formed on the growth substrate 110. Before the sacrificial layer 130 is disposed, a buffer layer 120 may be disposed formed or otherwise formed on the growth substrate 110. Thus, the sacrificial layer 130 may be disposed on the buffer layer 120

Any substrate capable of growing a nitride layer may be used as the growth substrate 110. The growth substrate 110 may include a heterogeneous substrate (i.e., at least one of a sapphire ($Al_2O_3$) substrate, a silicon carbide (SiC) substrate, and a silicon (Si) substrate). For example, the growth substrate 110 may include the sapphire substrate. When the growth substrate 110 is a sapphire substrate, the sapphire substrate may have a growth plane of c-plane (0001), r-plane (1-102), a-plane (11-20), or m-plane (10-10), and a growth plane of a fabricated nitride substrate will be determined based on the growth plane of the sapphire substrate. Exemplary embodiments provide a method of fabricating a large nitride substrate using the sapphire substrate as an inexpensive growth substrate.

Referring to FIG. 1A, the buffer layer 120 may be formed on the growth substrate 110. The buffer layer 120 may include a nitride (i.e., at least one of aluminum-based nitride, gallium-based nitride, and an indium-based nitride). For example, the buffer layer 120 may include a gallium-based nitride such as gallium nitride (GaN). The buffer layer 120 may be disposed or otherwise formed by any process capable of growing the buffer layer 120 on the growth substrate 110 (i.e., metal organic chemical vapor deposition (MOCVD)). For example, the buffer layer 120 may be disposed or otherwise formed by growing a GaN layer to a thickness of 20 nm to 50 nm on the growth substrate 110 at 500° C. to 600° C. by metal organic chemical vapor deposition.

The buffer layer 120 may act as a nucleus layer for growth of nitride layers in subsequent processes, and may relieve lattice mismatch between the growth substrate 110 and the nitride layers. Particularly, in this exemplary embodiment, the buffer layer 120 may be formed by metal organic chemical vapor deposition, thereby improving crystallinity of the nitride layers formed on the buffer layer 120.

Figure 1B:
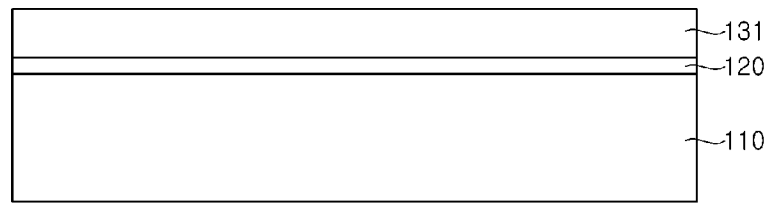
Figure 1C:
Figure 1D:
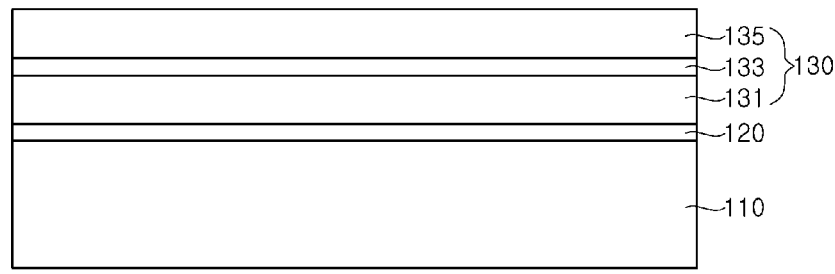

Referring to FIGS. 1B, 1C, and 1D, the sacrificial layer 130 may be disposed or otherwise formed on the buffer layer 120. The sacrificial layer 130 may include a horizontal etching layer 133 comprising indium (In) and an upper nitride sacrificial layer 135 disposed on the horizontal etching layer 133. In addition, the sacrificial layer 130 may further include a lower nitride sacrificial layer 131 disposed under the horizontal etching layer 133.

The lower nitride sacrificial layer 131 and the upper nitride sacrificial layer 135 may include a nitride (i.e., at least one of aluminum-based nitride, gallium-based nitride, and indium-based nitride). For example, the lower and upper nitride sacrificial layers 131, 135 may include gallium nitride (GaN). In addition, the lower and upper nitride sacrificial layers 131, 135 may be formed to have a thickness of 1 μm to 5 μm at a temperature of 1000° C. to 1200° C. by metal organic chemical vapor deposition. Because the lower and upper nitride sacrificial layers 131, 135 are formed by metal organic chemical vapor deposition, the nitride sacrificial layers may have improved crystallinity. However, it should be understood that the exemplary embodiments are not limited to forming only lower and upper nitride sacrificial layers 131, 135. Any number of lower and upper nitride sacrificial layers 131, 135 may be formed. In addition, any sacrificial layer may be formed by any deposition method.

After the lower nitride sacrificial layer 131 is disposed or otherwise formed, the horizontal etching layer 133 may be disposed or otherwise formed on the lower nitride sacrificial layer 131. The horizontal etching layer 133 may include nitride with indium (In) (i.e., an indium-based nitride) and may be formed to a thickness of 0.1 μm to 1 μm by metal organic chemical vapor deposition. In other words, the horizontal etching layer 133 may be formed to have a smaller thickness than the lower and upper nitride sacrificial layers 131, 135. Here, since the horizontal etching layer 133 includes an indium-based nitride, the horizontal etching layer 133 may be formed in a temperature range of 600° C. to 850° C. to provide for stable growth. Since the horizontal etching layer 133 forms the indium-based nitride at a lower temperature than the lower and upper nitride sacrificial layers 131, 135, the horizontal etching layer may be subjected to horizontal etching by an etching process described below. Furthermore, the horizontal etching layer 133 may further include an n-type dopant (i.e., silicon (Si)). Accordingly, the horizontal etching layer 133 may be an n-type nitride semiconductor layer. When the horizontal etching layer 133 includes an n-type dopant, the horizontal etching rate can be further increased in the etching process described below.

Figure 2:
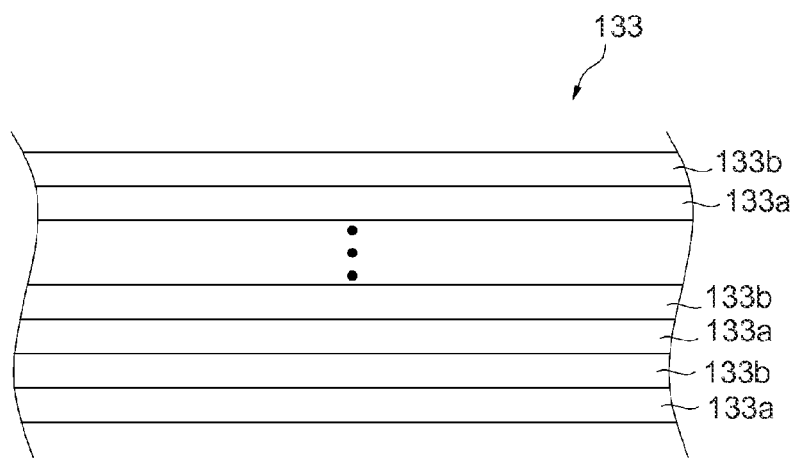
FIG. 2 is sectional view of a stack structure of a horizontal etching layer according to an exemplary embodiment.

FIG. 2 is a sectional view illustrating a stack structure of a horizontal etching layer 133. Referring to FIG. 2, the horizontal etching layer 133 may include a multilayer structure that may be an alternately stacked structure of $In_xGa_{1-x}N$ layers 133a and $Al_yIn_{1-y}N$ layers 133b (0<x<1, 0<y<1). Here, the $In_xGa_{1-x}N$ layers 133a and $Al_yIn_{1-y}N$ layers 133b repeated in the stacked structure may have various thicknesses within an overall thickness of the horizontal etching layer 133. However, it should be understood that the structure of the horizontal etching layer 133 is not limited to the illustration in FIG. 2 or FIG. 1D. Instead, the horizontal etching layer 133 may include three or more different sub-layers.

The indium-based nitride layer may be grown at a relatively low temperature and, thus, may have relatively poor crystallinity. However, according to an exemplary embodiment illustrated in FIG. 2, the horizontal etching layer 133 including the indium-based nitride is formed as a multilayer structure reducing stress and strain due to lattice mismatch between the horizontal etching layer 133 and the lower and upper nitride sacrificial layers 131, 135. Thus, in an exemplary embodiment, the horizontal etching layer 133 has improved crystallinity due to the multilayer structure as opposed to a single layer structure.

Further, since the lower nitride sacrificial layer 131 is additionally formed on the buffer layer 120 before formation of the horizontal etching layer 133, it is possible to suppress propagation of defects, such as dislocations present in the buffer layer 120, to future nitride layers formed on the buffer layer 120.

Figure 3A:
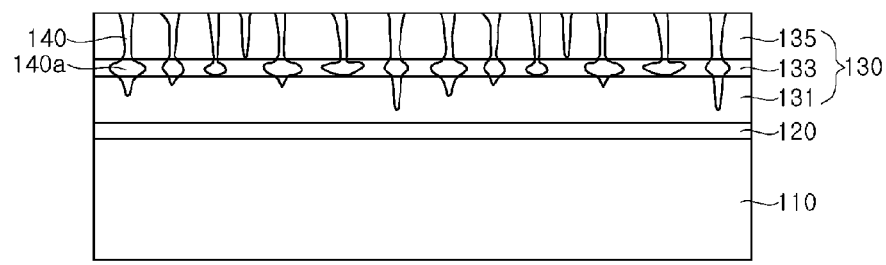
FIG. 3A is a sectional view illustrating partially etching a sacrificial layer according to an exemplary embodiment.
Figure 3B:
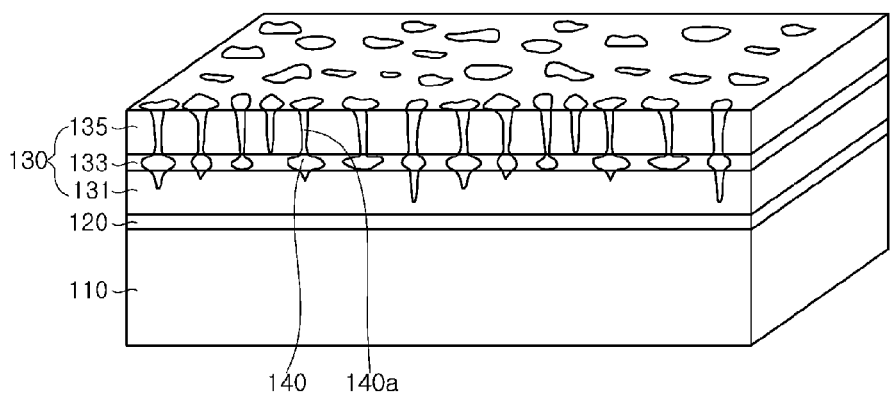
FIG. 3B is a perspective view of FIG. 3A.

Referring to FIGS. 3A and 3B, the sacrificial layer 130 may be partially etched. Here, partial etching of the sacrificial layer 130 may include horizontal etching of the horizontal etching layer 133.

As illustrated in FIG. 3A, partial etching of the sacrificial layer 130 may include etching at least portions of the upper nitride sacrificial layer 135, the horizontal etching layer 133, and the lower nitride sacrificial layer 131 from an upper surface of the sacrificial layer 130 in a downward direction. As a result, etching holes 140 may be formed to pass through the upper nitride sacrificial layer 135 such that some of the etching holes 140 may be formed only within the upper nitride sacrificial layer 135. Further, formation of the etching holes 140 may accompany horizontal etching, whereby the etching holes 140 may expand laterally in the horizontal etching layer 133 to form a horizontal etching region 140a. As shown in FIG. 3B, etching may be started from a portion of an upper surface of the upper nitride sacrificial layer 135. The etching start point may be irregularly formed on the upper surface of the upper nitride sacrificial layer 135.

Partial etching of the sacrificial layer 130 will be described in detail.

The upper nitride sacrificial layer 135 of the sacrificial layer 130 may be exposed to an etching gas at a first temperature. The first temperature may be 850° C. or more (i.e., a temperature range of 900° C. to 1200° C.). Any gas capable of etching the sacrificial layer 130 may be used as the etching gas, without limitation. In an exemplary embodiment, the etching gas includes at least one of chlorine gas ($Cl_2$) and ammonia ($NH_3$).

Since the upper nitride sacrificial layer 135 is exposed to the etching gas, etching proceeds downward from an upper surface of the upper nitride sacrificial layer 135. Here, etching is preferentially started by the etching gas at a portion of the upper nitride sacrificial layer 135 having a defect. More specifically, a portion of the upper nitride sacrificial layer 135 having a dislocation may be predominantly etched by the etching gas. Since the dislocation generally tends to propagate upwards and downwards as the nitride layers 131, 133, 135 are grown, the sacrificial layer 130 may include multiple dislocations formed in upward and downward directions in the upper nitride sacrificial layer 135. Thus, etching may proceed downward from the upper surface of the upper nitride sacrificial layer 135 along portions of the sacrificial layer 130 having the dislocations, thereby forming the etching holes 140.

In addition, the nitride layers 131, 133, 135 may be etched by chlorine gas and may be recrystallized by receiving nitrogen (N) from ammonia gas. Accordingly, the etching rate may be adjusted according to the ratio of the chlorine gas to the ammonia gas. For example, the etching rate may be decreased by increasing the ratio of the ammonia gas. In addition, the etching rate and etching degree may be adjusted according to the first temperature and exposure time to the etching gas. Accordingly, the width, size, and length of the etching holes 140 may be adjusted according to the etching rate and the etching degree.

When the etching holes 140 are formed to pass through the upper nitride sacrificial layer 135, the etching holes 140 may extend to the horizontal etching layer 133 and may also extend to the lower nitride sacrificial layer 131. When the etching holes 140 extend to the horizontal etching layer 133, the horizontal etching layer 133 may be subjected to horizontal etching. Accordingly, the horizontal etching layer 133 may be etched in a vertical direction and a horizontal direction. Etching of the nitride layers is influenced by growth temperature of the nitride layers. For example, since a gallium-based nitride layer and an aluminum-gallium-based nitride layer are grown at a higher temperature of 1000° C. or more, these layers can be etched only by an etching gas even upon etching at a temperature of 1000° C. or more. However, since the horizontal etching layer 133 may be a indium-based nitride layer (i.e., indium gallium nitride (InGaN) layer and/or an aluminum indium nitride (AlInN) layer) and is grown at a temperature of 850° C. or less, there is an area in which the indium-based nitride layer is additionally etched due to recrystallization and pyrolysis when etching is performed at a higher temperature than the growth temperature of the horizontal etching layer 133 with an indium-based nitride layer. As a result, the horizontal etching layer 133 may include an over-etched portion as compared with the lower and upper nitride sacrificial layers 131, 135, thereby forming a horizontal etching region 140a. The horizontal etching region 140a may be formed within the horizontal etching layer 133. A horizontal cross-sectional area of the etching holes 140 in the horizontal etching layer 133 may be greater than that of the etching holes 140 on the surface of the upper nitride sacrificial layer 135.

In addition, when the horizontal etching layer 133 includes an n-type dopant, (i.e., silicon (Si)) the horizontal etching rate in the horizontal etching layer 133 may be greater than when the horizontal etching layer 133 does not comprise n-doped silicon (Si) (i.e., an undoped horizontal etching layer 133). When the horizontal etching layer 133 includes the n-type dopant coherence between atoms in the horizontal etching layer 133 may be relatively weakened, thereby facilitating recrystallization and/or pyrolysis of the horizontal etching layer 133. As a result, the n-type doped horizontal etching layer 133 may have a horizontal etching region 140a with a greater width than an undoped horizontal etching layer 133.

Since the horizontal etching region 140a is formed in the horizontal etching layer 133, stress applied to a nitride epitaxial layer 190 (shown in FIGS. 7 and 8) may be relieved in a subsequent process. Moreover, a process of separating a nitride epitaxial layer 190 from the growth substrate 110 may be facilitated.

Next, referring to FIGS. 4A, 4B, 5A, 5B, 5C, 5D, 6A, and 6B, first and second mask patterns 150, 170 may be further formed before growth of the nitride epitaxial layer 190.

Figure 4A:
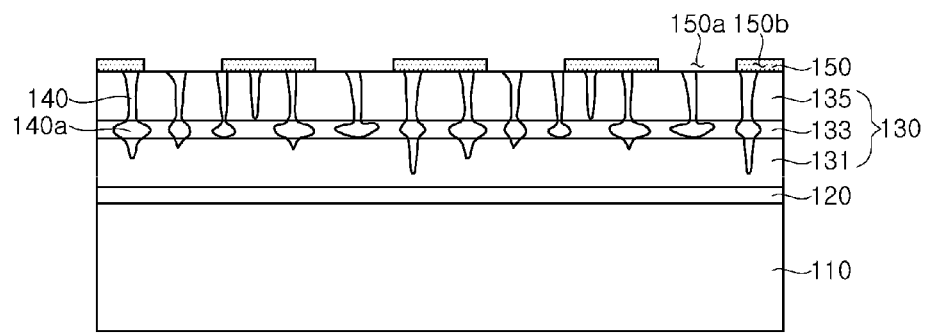
FIGS. 4A and 4B are sectional views illustrating forming a first mask pattern and a first nitride layer on the upper epitaxial layer according to an exemplary embodiment.
Figure 4B:
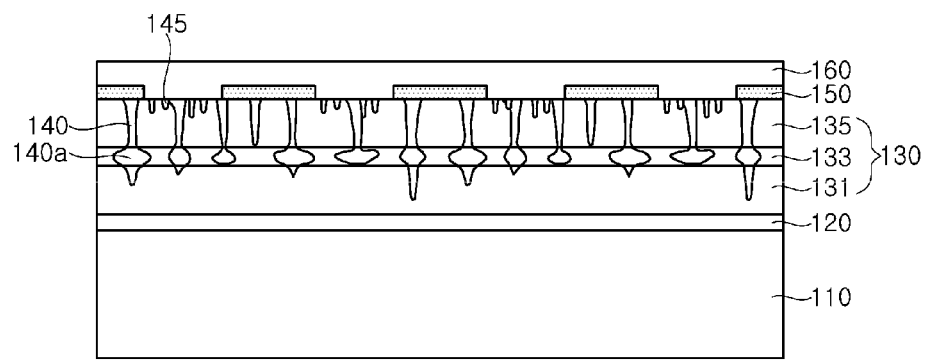

Referring to FIG. 4A, a first mask pattern 150 having an opening portion 150a and a masking portion 150b may be disposed or otherwise formed on the upper nitride epitaxial layer 135. As shown in FIG. 4B, a first nitride layer 160 may be disposed or otherwise formed on the upper nitride sacrificial layer 135 to cover the first mask pattern 150. Forming of the first nitride layer 160 may include forming a void 145 on the top surface of the sacrificial layer 130 (i.e., the upper nitride epitaxial layer 135) between the first nitride layer 160 and the sacrificial layer 130.

The first mask pattern 150 may be disposed or otherwise formed by depositing a material including silicon dioxide ($SiO_2$), followed by patterning. In an exemplary embodiment, e-beam evaporation may deposit the silicon dioxide. However, deposition the silicon dioxide or other material may be conducted by any suitable means. For example, the first mask pattern 150 may include other materials as well as silicon dioxide and may be formed by a lift-off process.

Figure 5A:
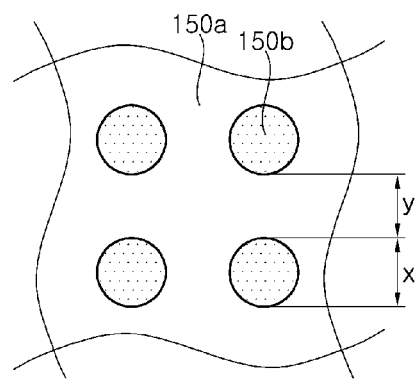
FIG. 5A is a plan view of a nitride substrate with a first mask pattern having a circular pattern according to an exemplary embodiment.
Figure 5B:
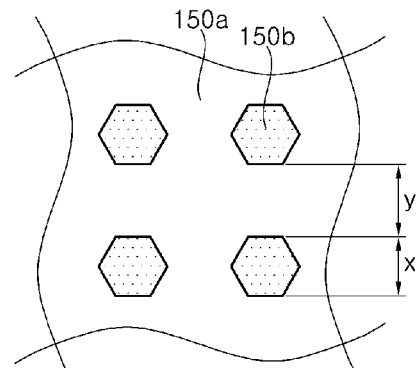
FIG. 5B is a plan view of a nitride substrate with a first mask pattern having a hexagonal pattern according to an exemplary embodiment.
Figure 5C:
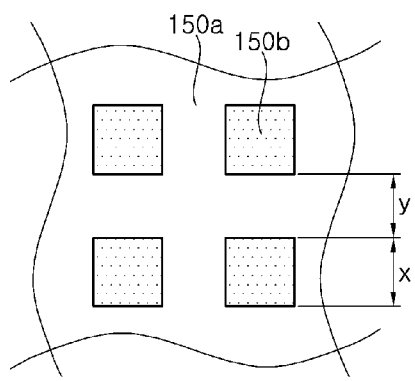
FIG. 5C is a plan view of a nitride substrate with a first mask pattern having a rectangular pattern according to an exemplary embodiment.
Figure 5D:
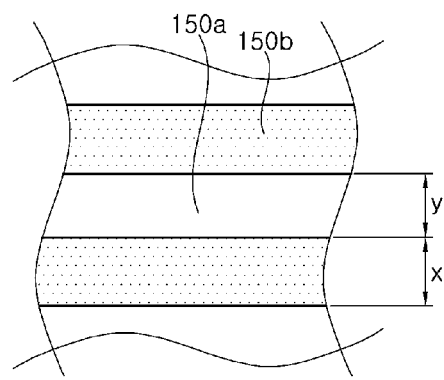
FIG. 5D is a plan view of a nitride substrate with a first mask pattern having a stripe pattern according to an exemplary embodiment.

As shown in FIGS. 5A, 5B, 5C, and 5D, the first mask pattern 150, the opening portion 150a, and the masking portion 150b may be formed in various shapes. For example, the masking portion 150b may have a circular pattern, as shown in FIG. 5A. In another example, the masking portion 150b may have a hexagonal pattern, as shown in FIG. 5B. In another example, the masking portion 150b may have a rectangular pattern, such as a square. In another example, the masking portion 150b may have a stripe pattern. In the exemplary pattern shapes shown in FIGS. 5A-5D, each of a width (y) of the opening portion 150a and a width (x) of the masking portion 150b may range from 2 μm to 20 μm. In particular, the opening portion 150a may have a width (y) of 20 μm to effectively relieve stress applied to the nitride epitaxial layer

190. In an exemplary embodiment, the first mask pattern 150 is a convex pattern. However, it should be understood that exemplary embodiments are not limited to the first mask pattern 150 being a convex pattern. For example, the first mask pattern 150 may be a concave pattern.

Referring back to FIG. 4B, the first nitride layer 160 covering the first mask pattern 150 may be grown in a lateral direction by metal organic chemical vapor deposition. The first nitride layer 160 may include at least one of an aluminum-based nitride, a gallium-based nitride, and an indium-based nitride. For example, the first nitride layer 160 may include gallium nitride (GaN).

When the first nitride layer 160 is formed, the void 145 may be formed at an interface between the first nitride layer 160 and the sacrificial layer 130. More specifically, the void 145 may be formed from at least a portion of the etching holes 140 by forming the first nitride layer 160. The void 145 may further relieve stress applied to the nitride epitaxial layer 190 in a subsequent process (shown in FIGS. 7 and 8).

Further, forming of the first nitride layer 160 may further include secondary horizontal etching of the horizontal etching layer 133. More specifically, during growth of the first nitride layer 160, the width of the horizontal etching region 140*a* of the horizontal etching layer 133 can increase. As described above, since the horizontal etching layer 133 includes an indium-based nitride, the horizontal etching layer 133 may be additionally etched at a higher temperature than the growth temperature of the horizontal etching layer 133. The horizontal etching region 140*a* may be enlarged during growth of the first nitride layer 160. Therefore, the horizontal etching layer 133 may be subjected to lateral etching not only by the process of etching the sacrificial layer 130 but also by a subsequent process where the horizontal etching region 140*a* can be further enlarged. Such additional horizontal etching of the horizontal etching layer 133 is not limited to the process of forming the first nitride layer 160, and may be additionally performed in a subsequent process (i.e., upon formation of a second nitride layer 180 and/or the nitride epitaxial layer 190 described with respect to FIGS. 6B, 7, and 8).

Thus, the first nitride layer 160 is grown in the lateral direction after formation of the first mask pattern 150, whereby crystallinity of the first nitride layer 160 can be improved while effectively preventing cracks in the nitride epitaxial layer 190 formed on the first nitride layer 160.

Figure 6A:
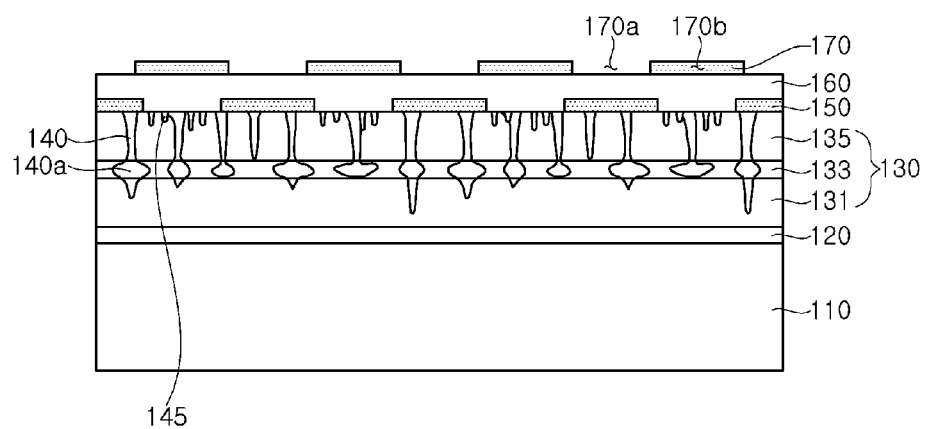
FIGS. 6A and 6B are sectional views illustrating forming a second mask pattern and a second nitride layer on the first nitride layer according to an exemplary embodiment.
Figure 6B:
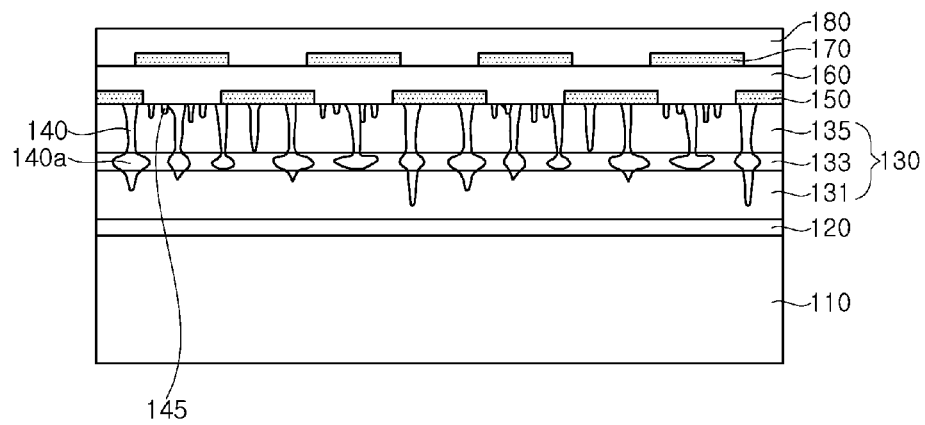

Referring to FIG. 6A, a second mask pattern 170 having an opening portion 170*a* and a masking portion 170*b* may be formed on the first nitride layer 160. Referring to FIG. 6B, the second nitride layer 180 may be formed on the first nitride layer 160 to cover the second mask pattern 170.

As shown in FIGS. 6A and 6B, the process of forming the second mask pattern 170 and the second nitride layer 180 is generally similar to the process of forming the first mask pattern 150 and the first nitride layer 160. Here, the masking portion 170*b* of the second mask pattern 170 may be disposed on the opening portion 150*a* of the first mask pattern 150. As a result, it is possible to effectively prevent propagation of dislocations from the first nitride layer 160 to the second nitride layer 180, thereby further improving crystallinity of the second nitride layer 180.

Alternatively, the forming of the first nitride layer 160 and the second nitride layer 180 may be omitted.

Figure 7:
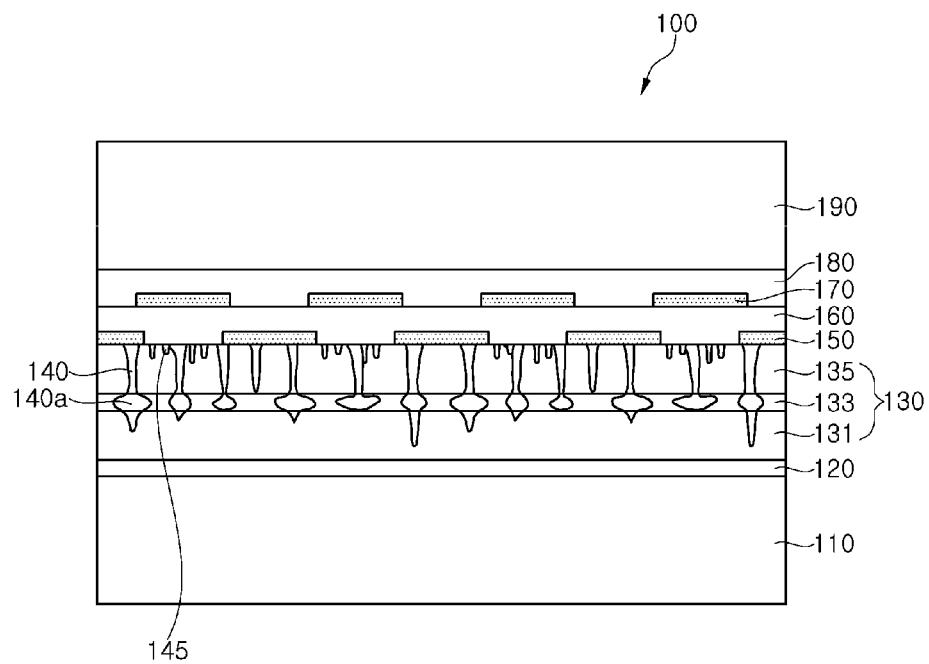
FIG. 7 is a sectional view illustrating forming a nitride epitaxial layer on the second nitride layer by hydride vapor phase epitaxy according to an exemplary embodiment.

Referring to FIG. 7, the nitride epitaxial layer 190 is disposed or otherwise formed on the second nitride layer 180 by hydride vapor phase epitaxy (HVPE).

As the nitride epitaxial layer 190 is formed, a wafer 100 for fabrication of a nitride substrate is provided. Accordingly, the wafer 100 for fabrication of a nitride substrate may include a growth substrate 110; a sacrificial layer 130 disposed on the growth substrate and a nitride epitaxial layer 190 disposed on the sacrificial layer 130. The sacrificial layer 130 may include a horizontal etching layer 133 and an upper nitride sacrificial layer 135 disposed on the horizontal etching layer 133. In particular, the sacrificial layer 130 may include at least one etching hole 140 formed through an upper nitride sacrificial layer 135 and reaching the horizontal etching layer 133, and the etching hole 140 may include a horizontal etching region 140*a* disposed within the horizontal etching layer 133. The wafer 100 for fabrication of a nitride substrate may further include a lower nitride sacrificial layer 131 disposed under the horizontal etching layer 133, a first mask pattern 150, and a first nitride layer 160 disposed on the sacrificial layer 130, and a second mask pattern 170 and a second nitride layer 180 disposed on the first nitride layer 160.

Detailed descriptions of the respective components of the wafer 100 for fabrication of a nitride substrate are generally the same as those described above, and thus will be omitted.

The nitride epitaxial layer 190 may be fabricated into a nitride substrate 200 through a subsequent process.

The nitride epitaxial layer 190 may include at least one of an aluminum-based nitride, a gallium-based nitride, and an indium-based nitride. For example, the nitride epitaxial layer 190 may be a single crystal GaN layer. The nitride epitaxial layer 190 may be grown at a second temperature by hydride vapor phase epitaxy. The second temperature may range from 1000° C. to 1200° C. Further, the nitride epitaxial layer 190 may be formed to various thicknesses. For example, the nitride epitaxial layer 190 may be formed to a thickness of 300 µm to 1000 µm to fabricate a single substrate. In an alternative example, the nitride epitaxial layer 190 may be formed to a thickness of several millimeters and be divided horizontally providing multiple substrates. Furthermore, the nitride epitaxial layer 190 may include an n-type dopant (i.e., silicon (Si)) or a p-type dopant (i.e., magnesium (Mg)).

In an exemplary embodiment, the sacrificial layer 130 and the first and second nitride layers 160, 180 may be formed before forming the nitride epitaxial layer 190 on a heterogeneous growth substrate 110. As a result, even when the nitride epitaxial layer 190 is grown to a thickness of 300 µm or more, stress and strain caused by a difference in the lattice parameter and the coefficient of thermal expansion between the growth substrate 110 and the nitride epitaxial layer 190 can be effectively relieved by the etching holes 140 and the void 145 of the sacrificial layer 130. Accordingly, it is possible to effectively prevent the nitride epitaxial layer 190 grown on the growth substrate 110 from bowing and the nitride epitaxial layer 190 from cracking. Thus, the nitride epitaxial layer 190 may have excellent crystallinity. As such, since bowing and cracking of the nitride epitaxial layer 190 are effectively suppressed, the fabrication method according to exemplary embodiments can provide significantly enhanced yield of the nitride epitaxial layer 190, thereby improving productivity of the nitride substrate. Therefore, the exemplary embodiments can solve problems in fabrication of a nitride substrate by growing a nitride semiconductor on a heterogeneous substrate (e.g., a sapphire substrate) through hydride vapor phase epitaxy.

Furthermore, since the nitride epitaxial layer 190 is formed after lateral growth of the first and second nitride layers 160, 180, the nitride epitaxial layer 190 may have further improved crystallinity and stress relieving effects. Thus, the nitride epitaxial layer 190 according to exemplary embodiment may have a very low dislocation density and may provide a nitride substrate 200 having a dislocation density of $10^5/cm^3$ or less.

Further, a thick nitride epitaxial layer 190 may be grown within a short period of time through hydride vapor phase epitaxy, thereby improving productivity.

Figure 8:
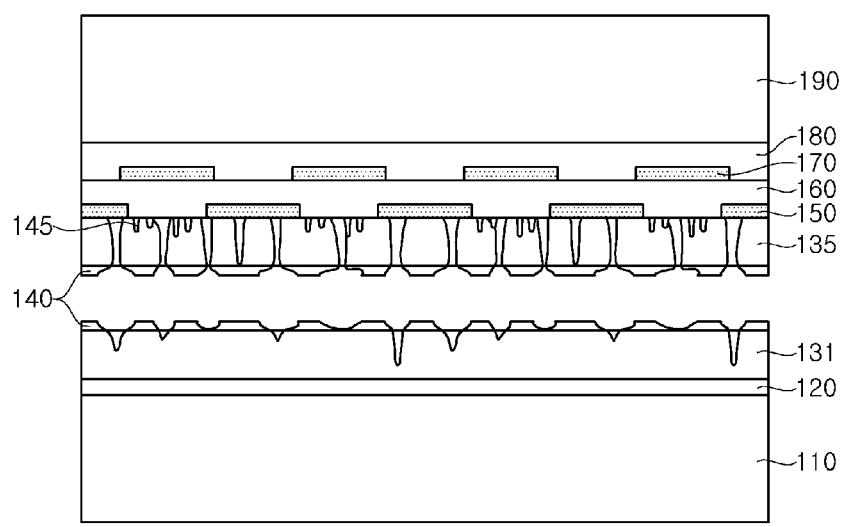
FIG. 8 is a sectional view illustrating separating the nitride epitaxial layer from the growth substrate according to an exemplary embodiment.

Referring to FIG. 8, the nitride epitaxial layer 190 may be separated from the growth substrate 110. Here, the horizontal etching layer 133 is separated, thereby allowing the nitride epitaxial layer 190 to be separated from the growth substrate 110.

The separation of the nitride epitaxial layer 190 from the growth substrate 110 may be performed at a third temperature lower than the second temperature. In other words, after forming the nitride epitaxial layer 190 at the second temperature through hydride vapor phase epitaxy, the nitride layers 120, 130, 150, 170, 190, and the growth substrate 110 are cooled to the third temperature to perform the separation process. Here, the third temperature may be 400° or less. When the nitride layers and the growth substrate are cooled to the third temperature, stress may be concentrated on a region between the growth substrate 110 and the nitride epitaxial layer 190 due to difference in coefficient of thermal expansion the growth substrate 110 and the nitride epitaxial layer 190. Separation may be started from a portion that exhibits the lowest cohesion in the stress-concentrated region. Thus, natural separation may occur around the horizontal etching layer 133 having the horizontal etching region 140a. In addition, external stress may be further applied to the horizontal etching layer 133 during the separation process.

In this way, during cooling, the nitride epitaxial layer 190 and the growth substrate 110 may be uniformly and naturally separated from each other, thereby facilitating the separation process without causing generation of cracks or fracture in the nitride epitaxial layer 190. In addition, the separation process may be performed without using laser lift-off, thereby solving problems caused by laser lift-off.

Figure 9:
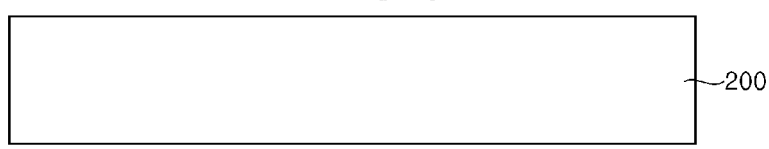
FIG. 9 is a sectional view illustrating removing the first and second nitride layers, the first and second mask patterns, the upper nitride sacrificial layer, and the remaining horizontal etching layer from the nitride epitaxial layer according to an exemplary embodiment.

After separating the nitride epitaxial layer 190 and the growth substrate 110, the first and second nitride layers 160, 180, the first and second mask patterns 150, 170, the upper nitride sacrificial layer 135 and the remaining horizontal etching layer 133 may be removed from the nitride epitaxial layer 190 by etching and/or polishing, thereby providing the nitride substrate 200 as shown in FIG. 9.

According to exemplary embodiments, the nitride epitaxial layer may be formed within a short period of time, be easily separated from the growth substrate, and be effectively prevented from cracking.

According to exemplary embodiments, a sacrificial layer comprising a horizontal etching layer is formed between a nitride epitaxial layer and a growth substrate to relieve stress caused by a difference in the lattice parameter and the coefficient of thermal expansion between the growth substrate and the nitride epitaxial layer. With this structure, the nitride epitaxial layer has improved crystallinity and the nitride substrate can be prevented from cracking and fracturing.

In addition, first and second nitride layers may be further formed on the growth substrate before forming the nitride epitaxial layer, thereby further enhancing crystallinity while preventing the nitride epitaxial layer from suffering from bowing and/or cracking by further relieving stress applied to the nitride epitaxial layer. Furthermore, the nitride epitaxial layer may be easily separated from the growth substrate through natural separation of the horizontal etching layer, thereby preventing the nitride epitaxial layer from cracking that typically occurs upon separation of the growth substrate from the nitride epitaxial layer.

Thus, a nitride substrate fabricated using the nitride epitaxial layer according to exemplary embodiments of the present invention can minimize defects such as dislocation, cracks, thereby improving process yield. In addition, exemplary embodiments provide a method of fabricating a nitride substrate having a very low defect density. Further, exemplary embodiments provide a method of fabricating a nitride substrate using HVPE, thereby providing high productivity.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of fabricating a nitride substrate, comprising:
   preparing a growth substrate;
   forming a sacrificial layer on the growth substrate, the sacrificial layer comprising:
      a nitride horizontal etching layer comprising an indium-based nitride; and
      an upper nitride sacrificial layer disposed on the nitride horizontal etching layer;
   horizontally etching the nitride horizontal etching layer;
   forming at least one etching hole at least partially through the upper nitride sacrificial layer such that the at least one etching hole expands in the nitride horizontal etching layer in a horizontal direction during horizontal etching of the nitride horizontal etching layer;
   forming a nitride epitaxial layer on the upper nitride sacrificial layer by hydride vapor phase epitaxy (HVPE); and
   separating the nitride epitaxial layer from the growth substrate at the nitride horizontal etching layer.

2. The method of claim 1, wherein the forming of the at least etching hole comprises exposing the upper nitride sacrificial layer to an etching gas at a first temperature.

3. The method of claim 2, wherein the first temperature is in a range of about 900° C. to about 1200° C.

4. The method of claim 2, wherein the horizontal etching of the nitride horizontal etching layer comprises at least one of recrystallization of the nitride horizontal etching layer and pyrolysis of the nitride horizontal etching layer.

5. The method of claim 2, wherein the etching gas comprises at least one of chlorine gas and ammonia gas.

6. The method of claim 1, wherein a horizontal cross-sectional area of the at least one etching hole within the nitride horizontal etching layer is greater than a different cross-sectional area of the at least one etching hole on a surface of the upper nitride sacrificial layer.

7. The method of claim 1, wherein the forming of the nitride epitaxial layer comprises forming a void on an upper surface of the sacrificial layer.

8. The method of claim 1, wherein the nitride horizontal etching layer comprises an alternately stacked structure of $In_xGa_{1-x}N$ layers and $Al_yIn_{1-y}N$ layers ($0<x<1$, $0<y<1$).

9. The method of claim 1, wherein the sacrificial layer is formed by metal organic chemical vapor deposition (MOCVD).

10. The method of claim 1, wherein the sacrificial layer further comprises a lower nitride sacrificial layer formed under the nitride horizontal etching layer.

11. The method of claim 1, wherein:
    the nitride epitaxial layer is formed at a second temperature, and
    the separating of the nitride epitaxial layer from the growth substrate is performed at a third temperature lower than the second temperature.

12. The method of claim 11, wherein the nitride epitaxial layer is separated from the growth substrate through natural separation of the nitride horizontal etching layer during cooling from the second temperature to the third temperature.

13. The method of claim 11, wherein the separating of the nitride epitaxial layer from the growth substrate further comprises applying stress to the nitride horizontal etching layer.

14. The method of claim 1, further comprising removing the upper nitride sacrificial layer and the nitride horizontal etching layer from the separated nitride epitaxial layer.

15. The method of claim 1, further comprising:
  forming a first mask pattern comprising a first opening portion and a first masking portion on the upper nitride sacrificial layer before the forming of the nitride epitaxial layer; and
  forming a first nitride layer on the upper nitride sacrificial layer to cover the first mask pattern before forming the nitride epitaxial layer.

16. The method of claim 15, wherein the forming the first nitride layer comprises forming at least one void on a surface of the sacrificial layer between the first nitride layer and the sacrificial layer.

17. The method of claim 15, wherein the first opening portion of the first mask pattern has a width in a range of about 2 μm to about 20 μm.

18. The method of claim 15, further comprising:
  forming a second mask pattern comprising a second opening portion and a second masking portion on the first nitride layer before forming the nitride epitaxial layer; and
  forming a second nitride layer on the first nitride layer to cover the second mask pattern,
  wherein the second masking portion of the second mask pattern is formed on the first opening portion of the first mask pattern.

19. The method of claim 15, wherein forming the first nitride layer comprises further horizontally etching the nitride horizontal etching layer.

20. The method of claim 1, further comprising:
  forming a buffer layer on the growth substrate before forming the sacrificial layer.

21. The method of claim 1, wherein the growth substrate comprises a sapphire substrate.

22. The method of claim 1, wherein the nitride epitaxial layer separated from the growth substrate comprises a gallium nitride (GaN) substrate.

23. The method of claim 1, wherein the nitride horizontal etching layer further comprises an n-type dopant.

24. A method of fabricating a nitride substrate, comprising:
  preparing a growth substrate;
  forming a sacrificial layer on the growth substrate, the sacrificial layer comprising:
    a nitride horizontal etching layer comprising indium gallium nitride (InGaN); and
    an upper gallium nitride (GaN) layer disposed on the nitride horizontal etching layer;
  partially etching the sacrificial layer to form etching holes, at least some of the etching holes extending to the nitride horizontal etching layer through the upper gallium nitride (GaN) layer;
  forming a nitride epitaxial layer on the upper gallium nitride (GaN) layer using hydride vapor phase epitaxy (HVPE); and
  separating the nitride epitaxial layer from the growth substrate,
  wherein the nitride epitaxial layer is separated from the growth substrate at the nitride horizontal etching layer, and an average width of a first portion of at least one of the etching holes disposed in the upper gallium nitride (GaN) layer is less than that of a second portion of the at least one of the etching holes formed in the nitride horizontal etching layer.

25. The method of claim 24, wherein the upper gallium nitride (GaN) layer has a thickness less than that of the nitride horizontal etching layer.

26. A wafer for fabrication of a nitride substrate, comprising:
  a growth substrate;
  a sacrificial layer disposed on the growth substrate, the sacrificial layer comprising:
    a nitride horizontal etching layer; and
    an upper nitride sacrificial layer disposed on the nitride horizontal etching layer; and
  a nitride epitaxial layer disposed on the sacrificial layer,
  wherein the sacrificial layer comprises at least one etching hole extending to the nitride horizontal etching layer through the upper nitride sacrificial layer, the etching hole comprising a horizontal etching region disposed within the nitride horizontal etching layer.

27. The wafer of claim 26, wherein an average width of a first portion of at least one of the etching holes disposed in the upper nitride sacrificial layer is less than that of a second portion of the at least one of the etching holes disposed in the nitride horizontal etching layer.

* * * * *